US009620215B2

(12) United States Patent
Matsuo et al.

(10) Patent No.: US 9,620,215 B2
(45) Date of Patent: Apr. 11, 2017

(54) EFFICIENTLY ACCESSING SHARED MEMORY BY SCHEDULING MULTIPLE ACCESS REQUESTS TRANSFERABLE IN BANK INTERLEAVE MODE AND CONTINUOUS MODE

(71) Applicant: International Business Machines Corporation, Armonk, NY (US)

(72) Inventors: Hisato Matsuo, Tokyo (JP); Rika Nagahara, Fukuoka (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/835,660

(22) Filed: Aug. 25, 2015

(65) Prior Publication Data
US 2016/0117123 A1 Apr. 28, 2016

(30) Foreign Application Priority Data
Oct. 23, 2014 (JP) ................ 2014-216196

(51) Int. Cl.
*G06F 12/00* (2006.01)
*G11C 16/00* (2006.01)
(Continued)

(52) U.S. Cl.
CPC ............ *G11C 16/00* (2013.01); *G06F 3/061* (2013.01); *G06F 3/0659* (2013.01); *G06F 13/1647* (2013.01); *G06F 13/1663* (2013.01)

(58) Field of Classification Search
CPC .... G06F 3/061; G06F 3/0659; G06F 13/1647; G06F 13/1663; G11C 16/00
(Continued)

(56) References Cited

U.S. PATENT DOCUMENTS 6,119,207 A 9/2000 Chee
7,216,182 B2 5/2007 Henkel
(Continued)

FOREIGN PATENT DOCUMENTS

JP 07084875 A 3/1995
JP 09282223 A 10/1997
(Continued)

OTHER PUBLICATIONS

JEDEC, "DDR3 SDRAM Standard: JESD79-3F," JEDEC, Definition webpage retrieved from https://www.jedec.org/standards-documents/docs/jesd-79-3d, Jul. 2012, pp. 1-2.
(Continued)

*Primary Examiner* — Hong Kim
(74) *Attorney, Agent, or Firm* — Mark G. Edwards (57) ABSTRACT

A scheduling device according to one embodiment includes an access request accepting section and an access request selecting section. The access request accepting section is configured to accept access requests from requesters. The access request selecting section is configured to select a first access request as a reference for access request selection from among the accepted access requests, select an access request transferable in a bank interleave (BI) mode with respect to the first access request, and select an access request transferable in a continuous read/write (CN) mode in response to a determination that there is no access request transferable in the BI mode, or that the preceding access request was in the BI or the CN mode. The access request selecting section is configured to repeat the selections in response to a determination that there is no access request transferable in the BI mode and in the CN mode.

20 Claims, 7 Drawing Sheets

(51) Int. Cl.
  *G06F 13/16* (2006.01)
  *G06F 3/06* (2006.01)

(58) Field of Classification Search
  USPC ............ 711/158, 157, 154, 15, 151, 147, 5;
   710/6, 40, 58, 107
  See application file for complete search history.

(56) References Cited

U.S. PATENT DOCUMENTS

| | | | |
|---|---|---|---|
| 7,356,631 | B2 | 4/2008 | Lin |
| 7,664,922 | B2 | 2/2010 | Ohtsuka et al. |
| 8,412,891 | B2* | 4/2013 | Demura ................. G06F 13/161 710/111 |
| 9,208,002 | B2* | 12/2015 | Matsuo ................. G06F 15/167 |
| 2004/0243900 | A1 | 12/2004 | Henkel |
| 2006/0168383 | A1 | 7/2006 | Lin |
| 2007/0016732 | A1 | 1/2007 | Ohtsuka et al. |
| 2010/0070742 | A1* | 3/2010 | Dowling ............. G06F 9/30032 712/225 |
| 2011/0035559 | A1* | 2/2011 | Asai .................... G06F 13/1642 711/154 |
| 2011/0125946 | A1* | 5/2011 | Demura ................. G06F 13/161 710/111 |
| 2013/0179645 | A1* | 7/2013 | Matsuo ................. G06F 15/167 711/151 |
| 2014/0059286 | A1* | 2/2014 | Matsuo ............... G06F 13/1647 711/105 |
| 2014/0189181 | A1* | 7/2014 | Cheng ................... G06F 13/374 710/118 |

FOREIGN PATENT DOCUMENTS

| | | |
|---|---|---|
| JP | 10333979 A | 12/1998 |
| JP | 2000105587 A | 4/2000 |
| JP | 2000315172 A | 11/2000 |
| JP | 2000330866 A | 11/2000 |
| JP | 2004362567 A | 12/2004 |
| JP | 2006202244 A | 8/2006 |
| JP | 2006318178 A | 11/2006 |
| JP | 2008140065 A | 6/2008 |
| JP | 2012083946 A | 4/2012 |
| JP | 2014167763 A | 6/2016 |
| WO | 2012070319 A1 | 5/2012 |

OTHER PUBLICATIONS

Statement of Relevance of Non-Translated Foreign Document JP200330866.
Unknown, "Decision to Grant a Patent" for patent titled "Device, Method, and Computer Program for Scheduling Access Requests to Shared Memory," Patent Application No. 2014-216196, dated Mar. 2, 2016, translated May 27, 2016, 6 pages.
Matsuo, et al., "Device, Method, and Computer Program for Scheduling Access Requests to Shared Memory," Filed Oct. 23, 2014, English Translated Application, 34 pages.

* cited by examiner

| PROCESSOR ID | ADDRESS | R/W |
|---|---|---|
| P1 (1) | Bank1, Row10 | R |
| P1 (2) | Bank1, Row10 | R |
| Pm (1) | Bank1, Row3 | W |
| P3 (1) | Bank1, Row7 | R |
| P3 (2) | Bank8, Row6 | W |
| P2 (1) | Bank8, Row10 | W |
| P2 (2) | Bank1, Row10 | R |
| P3 (3) | Bank8, Row6 | R |
| Pm (2) | Bank1, Row3 | W |
| Pm (3) | Bank1, Row10 | R |
| P1 (3) | Bank1, Row10 | R |
| ⋮ | ⋮ | ⋮ |
| P1 (n) | Bank1, Row10 | R |
| ⋮ | ⋮ | ⋮ |
| Pm (n) | Bank1, Row3 | W |

EFFICIENTLY ACCESSING SHARED MEMORY BY SCHEDULING MULTIPLE ACCESS REQUESTS TRANSFERABLE IN BANK INTERLEAVE MODE AND CONTINUOUS MODE

BACKGROUND

The present invention relates to the control of access to a shared memory, and more particularly to a device, method, and computer program product for scheduling access requests from each requester to a memory shared by multiple requesters.

In various information processing apparatuses including computers and storage devices, a reduction in power consumption and cost has been a critical issue. For example, recent tape drives have adopted a configuration for sharing an external memory, such as a dynamic random access memory (DRAM), among multiple devices, including one or more processors, e.g., central processing units (CPUs). Sharing a memory may reduce the number of memory chips compared with each device having a specific memory, resulting in a reduction in power consumption and cost, and downsizing of a circuit board.

However, use of a shared memory system may lead to a longer turnaround time for memory access from a requester, such as a processor, and therefore adversely impact the performance of the shared memory system. The performance is also degraded when bus usage in the shared memory system is inefficient. Therefore, there is an urgent need to reduce the turnaround time and improve the bus usage efficiency in shared memory systems.

When an access request from a processor is sent to an external DRAM, the turnaround time of the access request depends on at least the protocol overhead of the DRAM (the time from when an address to be accessed is activated until the address is deactivated after the completion of the access). Further, if a second processor issues another access request while a first access request is being processed, the second processor will have to wait for its own access request to be processed until the processing of the first access request is completed. This increases the turnaround time of the second processor. Known techniques for improving the turnaround time in the shared memory system include a bank interleave mode (hereinafter called the BI mode) and a continuous read/write mode (hereinafter called the CN mode).

In the BI mode, for example, an active command may be used to open or activate multiple banks of the DRAM. A controller sends multiple access requests having different bank addresses to the activated multiple banks in an interleaved manner to enable a reduction in turnaround time.

In the CN mode, the controller may issue a write command or a read command having the same bank address and row address as the bank address and row address specified in the previous access request to continue access cycles, and this may lead to a reduction in protocol overhead and turnaround time.

The BI mode and the CN mode contribute to the reduction in protocol overhead and the improvement of the DRAM bus efficiency. However, when the address of an access request does not meet conditions in the BI mode and the CN mode, transfer in a normal mode is performed. In the normal mode, addresses are activated and deactivated for each read or write command.

Figure 1A:
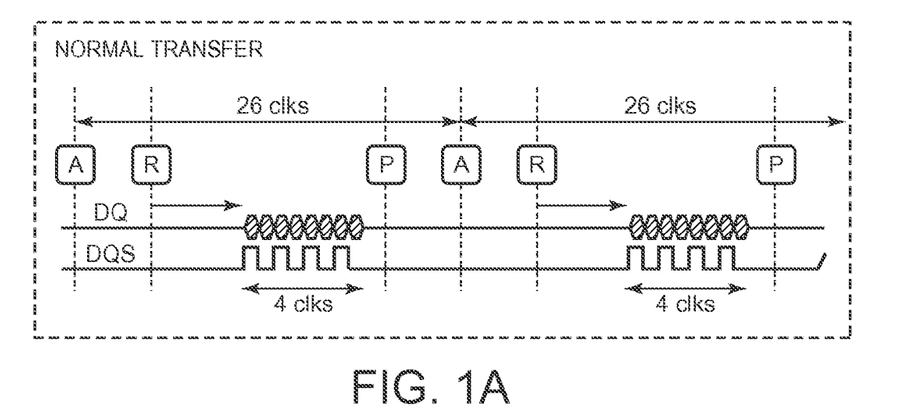
FIGS. 1A-1C include diagrams showing protocol overheads when two read commands are processed in a normal mode, a BI mode, and a CN mode, respectively.
Figure 1B:
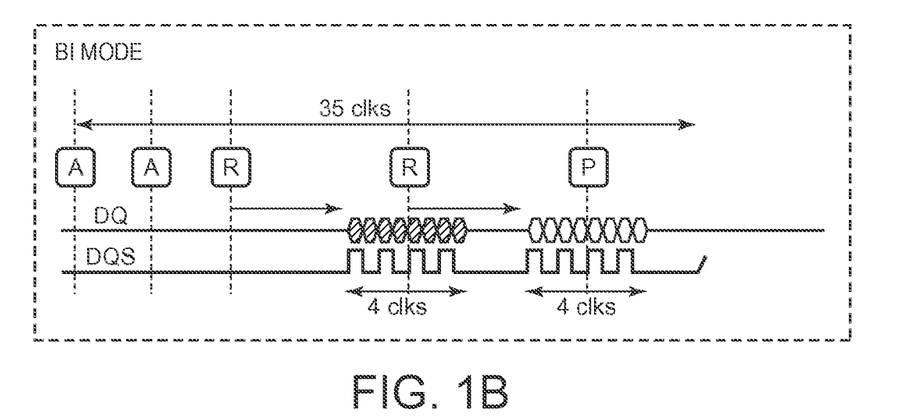
Figure 1C:
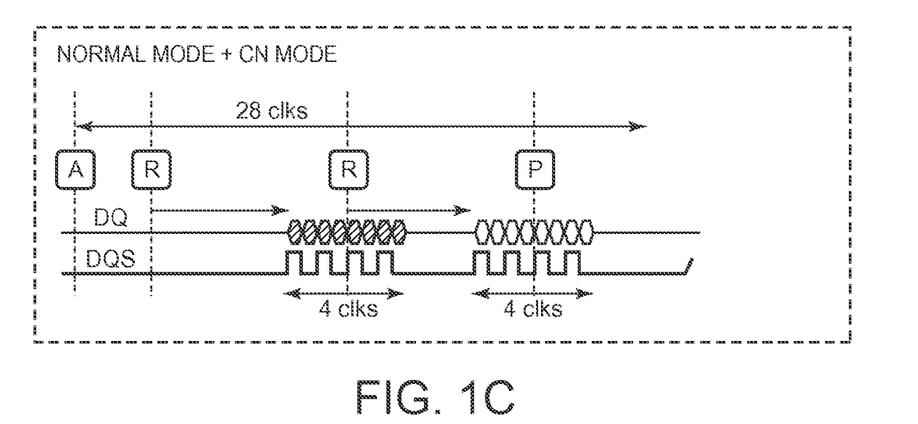

An example of protocol overhead when a double data rate type three synchronous dynamic random access memory (DDR3 SDRAM) is used as the DRAM and two read commands are continuously processed is shown in FIGS. 1A-1C. Each alphabetical letter in FIGS. 1A-1C denotes a command described in U.S. Patent Application Publication No. 2014/0059286 A1, where A denotes an active command, R denotes a read command, and P denotes a precharge command. Further, DQ denotes a data signal and DQS denotes a data strobe signal.

(A) Normal Transfer

In the case of a normal transfer as shown in FIG. 1A, 26 clocks are required for each read command R from the start of the activation of a bank address and a row address by an active command A until completion of the deactivation of these addresses by a precharge command P. Therefore, protocol overhead when two read commands R are continuously processed is 52 clocks.

(B) BI Mode

In the BI mode as shown in FIG. 1B, since reading from two banks is performed, two reads are continuously performed after being activated by active commands A, and a precharge command is finally executed once. The total protocol overhead is 35 clocks.

(C) Normal+CN Mode

Since transfer in the CN mode is performed on the same bank address and row address as those of the preceding command (here, the read command in the normal mode), it is only necessary to activate the address by an active command A only initially and to execute a precharge command only once at the end, as shown in FIG. 1C. Therefore, the protocol overhead is 28 clocks, which is the shortest. The CN mode is the best in terms of only the protocol overhead.

U.S. Patent Application Publication No. 2014/0059286 A1 describes a memory access device for processing multiple access requests in one bus cycle. This memory access device includes a CPU interface connected to multiple CPUs using a memory as a main memory to control access transfer from the multiple CPUs to the memory, and a DRAM controller for arbitrating access transfer to the memory. The CPU interface keeps access requests from the multiple CPUs waiting, receives and stores the addresses, data transfer mode, and data size of each access, and notifies the DRAM controller of the access requests. When receiving a permission signal for an access request, the CPU interface sends information to the DRAM controller in response to the permission signal. The DRAM controller receives an access request signal, specifies a CPU permitted to perform a transfer based on access arbitration, and sends the permission signal to the CPU interface.

Further, in U.S. Patent Application Publication No. 2013/0179645 A1, a method for equalizing the waiting times of multiple requesters using a shared memory system is described. According to the method, the longest-waiting access request is selected among the access requests from the multiple requesters to send the longest-waiting access request to the shared memory system after the other access requests so that a requester issuing the longest-waiting access request may send an additional access request to the shared memory system following the permitted longest-waiting access request.

BRIEF SUMMARY

In one embodiment, a scheduling device for scheduling access requests from each of a plurality of requesters to a memory shared among the plurality of requesters includes an access request accepting section and an access request selecting section. The access request accepting section is configured to accept access requests from each of the plurality of requesters. The access request selecting section is configured to select a first access request as a reference for access request selection from among the access requests accepted by the access request accepting section, select an access request transferable in a bank interleave (BI) mode with respect to the first access request, and select an access request transferable in a continuous read/write (CN) mode in response to a determination that there is no access request transferable in the BI mode or a preceding access request was in the BI mode or the CN mode. Furthermore, in response to a determination that there is no access request transferable in the BI mode and that there is no access request transferable in the CN mode, the access request selecting section repeats selection of the first access request, the access request transferable in the BI mode, and the access request transferable in the CN mode from among access requests that have not been selected yet.

A method for scheduling access requests from each of a plurality of requesters to a memory shared among the plurality of requesters includes accepting access requests from each of the plurality of requesters. The method also includes selecting a first access request as a reference for an access request selection from among the access requests. Moreover, the method includes selecting an access request transferable in a bank interleave (BI) mode with respect to the first access request. Also, the method includes selecting an access request transferable in a continuous read/write (CN) mode in response to a determination that no access request is transferable in the BI mode or that a preceding access request was transferable in the BI mode or the CN mode. The step of selecting the first access request, the step of selecting the access request transferable in the BI mode, and the step of selecting the access request transferable in the CN mode from among access requests that have not been selected yet are repeated in response to a determination that there is no access request transferable in the BI mode and that there is no access request transferable in the CN mode.

In another embodiment, a computer program product for scheduling access requests from each of a plurality of requesters to a memory shared among the plurality of requesters includes a memory having program instructions embodied therewith. The embodied program instructions are readable by a computer to cause the computer to perform a method. The method includes accepting access requests from each of the plurality of requesters. The method also includes selecting a first access request as a reference for an access request selection from among the access requests. Moreover, the method includes selecting an access request transferable in a bank interleave (BI) mode with respect to the first access request. Also, the method includes selecting an access request transferable in a continuous read/write (CN) mode in response to a determination that no access request is transferable in the BI mode or that a preceding access request was transferable in the BI mode or the CN mode. The step of selecting the first access request, the step of selecting the access request transferable in the BI mode, and the step of selecting the access request transferable in the CN mode from among access requests that have not been selected yet are repeated in response to a determination that there is no access request transferable in the BI mode and that there is no access request transferable in the CN mode.

DETAILED DESCRIPTION

From the standpoint of performance of a shared memory system, it is important to increase bus usage efficiency, i.e., bandwidth (transfer bytes per unit time) of an interface to a shared memory. To this end, there is a need to maximize the burst transfer size of multiple access requests within the limit of an allowable access time allocated to each interface. However, in U.S. Patent Application Publication No. 2013/0179645 A1 (now U.S. Pat. No. 9,208,002 B2 issued Dec. 8, 2015) if BI mode is disabled at the start of transfer, overhead will become large because normal transfer is performed on access requests from N processors as the requesters of shared memory accesses. Further, in U.S. Patent Application Publication No. 2013/0179645 A1, although the number of access requests transferable in one transfer cycle is limited, since overhead varies from transfer mode to transfer mode as mentioned above, the transfer may be aborted even if there is a sufficient allowable access time allocated. Therefore, the method described in U.S. Patent Application Publication No. 2013/0179645 A1 is unfit for maximizing the burst transfer size.

Therefore, in one embodiment, scheduling multiple access requests to a shared memory properly in order to improve the turnaround time and bus usage efficiency is presented.

In one embodiment, a device is provided for scheduling access requests from each of multiple requesters to a memory shared among the multiple requesters, including: an access request accepting section for accepting access requests from each of the requesters; and an access request selecting section for selecting a first access request as a reference for access request selection from among the access requests accepted by the access request accepting section, selecting an access request transferable in a BI mode with respect to the first access request, and when there is no access request transferable in the BI mode or when the preceding access request is in the BI mode or a CN mode, selecting an access request transferable in the CN mode. The access request selecting section is configured to repeat, when there is no access request transferable in the BI mode or when there is no access request transferable in the CN mode, the selection of the first access request, the access request transferable in the BI mode, and the access request transferable in the CN mode from among access requests that have not been selected yet.

Another embodiment provides a method of scheduling access requests from each of multiple requesters to a memory shared among the multiple requesters, including the steps of: accepting access requests from each of the requesters; selecting a first access request as a reference for access request selection from among the access requests accepted in the accepting step; selecting an access request transferable in a BI mode with respect to the first access request; and when there is no access request transferable in the BI mode or when the preceding access request is in the BI mode or a CN mode, selecting an access request transferable in the CN mode. When there is no access request transferable in the BI mode or when there is no access request transferable in the CN mode, the step of selecting the first access request, the step of selecting the access request transferable in the BI mode, and the step of selecting the access request transferable in the CN mode from among access requests that have not been selected yet are repeated.

Yet another embodiment provides a computer program for scheduling access requests from each of multiple requesters to a memory shared among the multiple requesters, the computer program causing a computer to execute each step of the method according to the method described above.

In one embodiment, the first access request as a reference for the access request selection may be an access request having the longest latency among access requests stored in a FIFO buffer.

Further, in one embodiment, the selection of the access request transferable in the BI mode and the selection of the access request transferable in the CN mode may be made by scanning access requests stored in the FIFO buffer in order of latency starting from an access request having the longest latency to determine whether there is an access request transferable in the BI mode and whether there is an access request transferable in the CN mode, respectively.

Further, in accordance with one embodiment, a predetermined access time may be allocated to the scheduling device so that the selection of the respective access requests will be repeated within the limit of this access time upon selecting the first access request, the access request transferable in the BI mode, and the access request transferable in the CN mode.

Further, in one embodiment, upon selecting the first access request, the access request transferable in the BI mode, and the access request transferable in the CN mode, protocol overhead of a selected access request may be accumulated each time the access request is selected so that a cumulative time will be compared with the allocated access time to determine whether the cumulative value goes beyond the limit of the access time.

Figure 2:
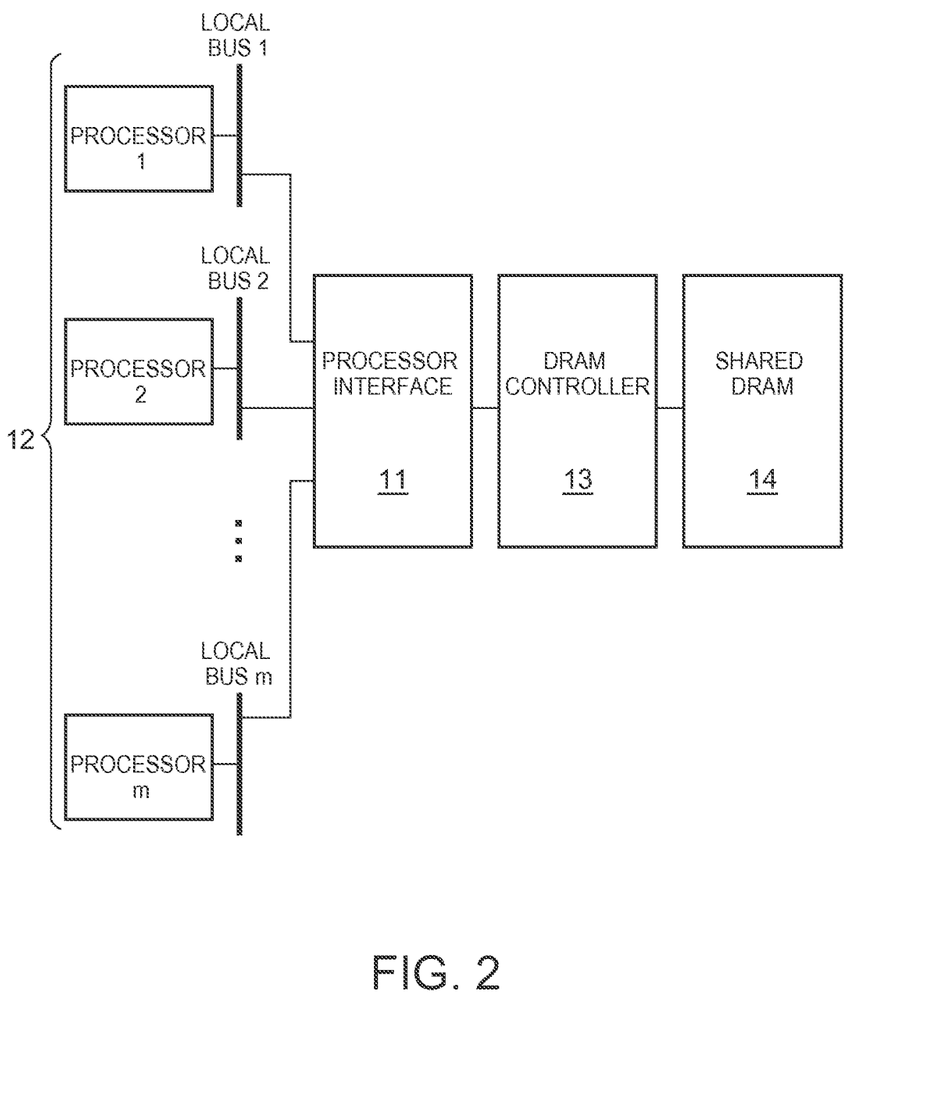
FIG. 2 is a block diagram showing an exemplary configuration of a shared memory system including a scheduling device according to one embodiment.

One configuration example of a shared memory system including a scheduling device according to one embodiment is shown in FIG. 2. In FIG. 2, a processor interface 11 may function as a scheduling device according to one embodiment. Multiple processors 12 (processor 1, processor 2, ..., processor m) are connected to the processor interface 11 through respective local buses, and these processors 12 become requesters to a shared DRAM 14. The processor interface 11 sends a DRAM controller 13 access requests from each processor 12 all in one transfer package by scheduling, to be described later. The DRAM controller 13 accesses a shared DRAM 14 according to the access requests (read or write) included in this transfer package.

Figure 3:
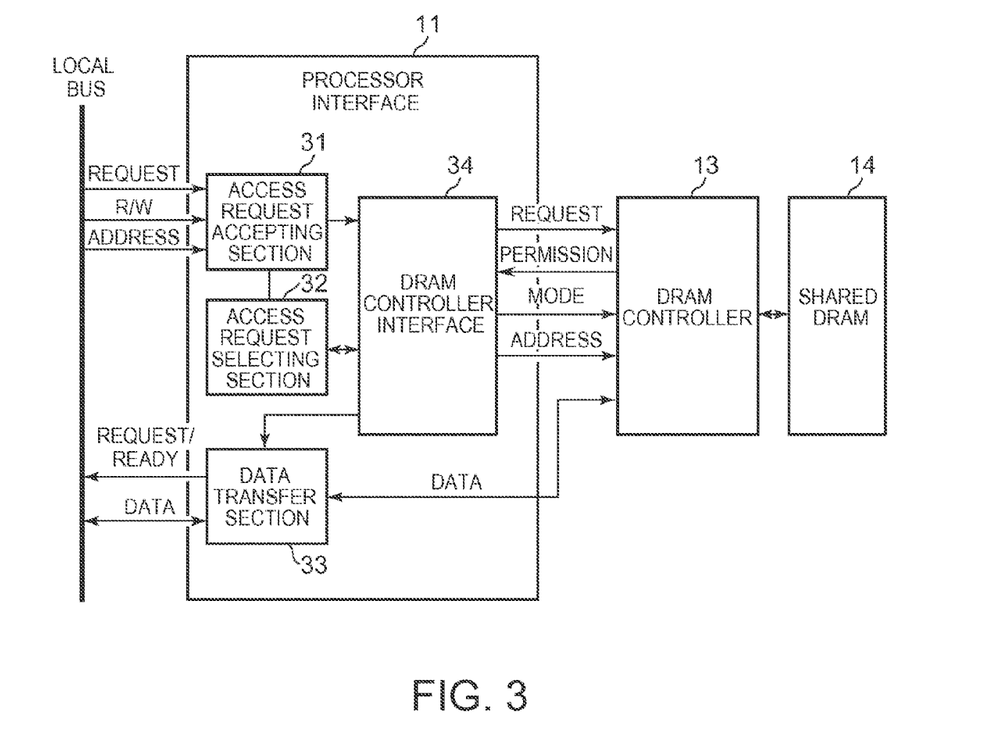
FIG. 3 is a block diagram showing details of a processor interface functioning as a scheduling device according to one embodiment.

The details of the processor interface 11 are shown in FIG. 3 in one embodiment. As shown, the processor interface 11 includes an access request accepting section 31 for accepting access requests from each processor through a local bus, an access request selecting section 32 for making selections of the access requests accepted by the access request accepting section 31 according to predetermined criteria and grouping the access requests together in one transfer package, a data transfer section 33 for transferring read data or write data between the local bus of each processor and the DRAM controller 13, and a DRAM controller interface 34 for providing an interface to the DRAM controller 13.

The access request accepting section 31 is connected to a request line, an R/W line, and an address line of the local bus to store a signal on the R/W line indicative of read or write and an address signal on the address line, namely a bank address, a row address, and a column address of the shared DRAM 14 in response to the fact that a processor having an access request raises the request line. In the embodiment, the access request accepting section 31 includes a FIFO buffer (hereinafter called the request FIFO), and an example of each entry in the FIFO buffer is shown in FIG. 4 in accordance with one embodiment.

Figure 4:
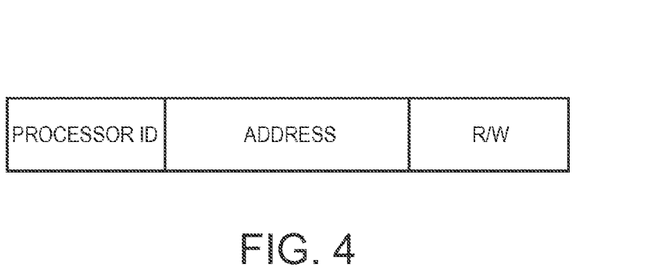
FIG. 4 is a block diagram showing an example of an entry in a request first-in first-out (FIFO) buffer included in an access request accepting section of the processor interface in one embodiment.

As shown in FIG. 4, each entry in the request FIFO includes a processor identifier (ID) for identifying a processor that has issued an access request, the address signal, and R/W signal mentioned above. The processor that has issued the access request may be identified from the local bus. In other words, as shown in FIG. 2, since a dedicated local bus is connected to each processor 12, the access request accepting section 31 may identify the processor that has issued the access request from the local bus that has raised the request line. The access request accepting section 31 stores, in the request FIFO, the ID of the identified processor (which may be the number of each processor such as 1, 2, ..., m as shown in FIG. 2). When accepting an access request from a processor 12, the access request accepting section 31 notifies the DRAM controller interface 34 thereof.

As will be described in detail later, when being permitted by the DRAM controller 13, the access request selecting section 32 selects access requests according to the predetermined criteria from among the access requests stored in the request FIFO of the access request accepting section 31, creates a transfer package including these access requests, and sends the transfer package to the DRAM controller interface 34.

The data transfer section 33 is a circuit for temporarily storing read data read from the shared DRAM 14 and write data to be written to the shared DRAM 14, transferring the read data to a processor as a requester, and transferring the write data to the DRAM controller 13. In one embodiment, the data transfer section 33 also uses a FIFO buffer like the access request accepting section 31 to store these pieces of data. Though not shown, this FIFO buffer includes a FIFO buffer for read data (hereinafter called the read FIFO) and a FIFO buffer for write data (hereinafter called the write FIFO).

The DRAM controller interface 34 is configured to provide an interface to the DRAM controller 13. When the acceptance of an access request is notified from the access request accepting section 31, the DRAM controller interface 34 sends a request signal to the DRAM controller 13 and waits for a permission signal from the DRAM controller 13. When access to the shared DRAM 14 is available, the DRAM controller 13 returns the permission signal to the DRAM controller interface 34. When receiving the permission signal, the DRAM controller interface 34 causes the access request selecting section 32 to start selecting access requests and creating a transfer package. Then, in response to each access request included in the transfer package from the access request selecting section 32, the DRAM controller interface 34 sends the DRAM controller 13 necessary mode signal and address signal. In addition to the R/W signal mentioned above, a signal indicative of the BI mode or the CN mode is also included in the mode signal. In response to these signals, the DRAM controller 13 performs access to the shared DRAM.

Each component shown in FIG. 3 may be the same as a corresponding component described in U.S. Patent Application Publication No. 2014/0059286 A1, except for the access request selecting section 32.

Though not shown in FIGS. 2 and 3, the DRAM controller 13 may also be connected to the interface of any functional unit using the shared DRAM 14 other than the processor interface 11 (for example, a servo circuit, an error correction circuit, and the like use a shared DRAM in a tape drive). In this case, the DRAM controller 13 includes an arbiter for arbitrating requests from each interface as also described in U.S. Patent Application Publication No. 2014/0059286 A1, and a permission signal is sent to an interface permitted by this arbiter. In a configuration where multiple interfaces are connected to the DRAM controller 13, a predetermined allowable access time is generally allocated to each interface so that each interface may send multiple access requests to the DRAM controller 13 in a time-sharing manner within the limit.

Figure 5:
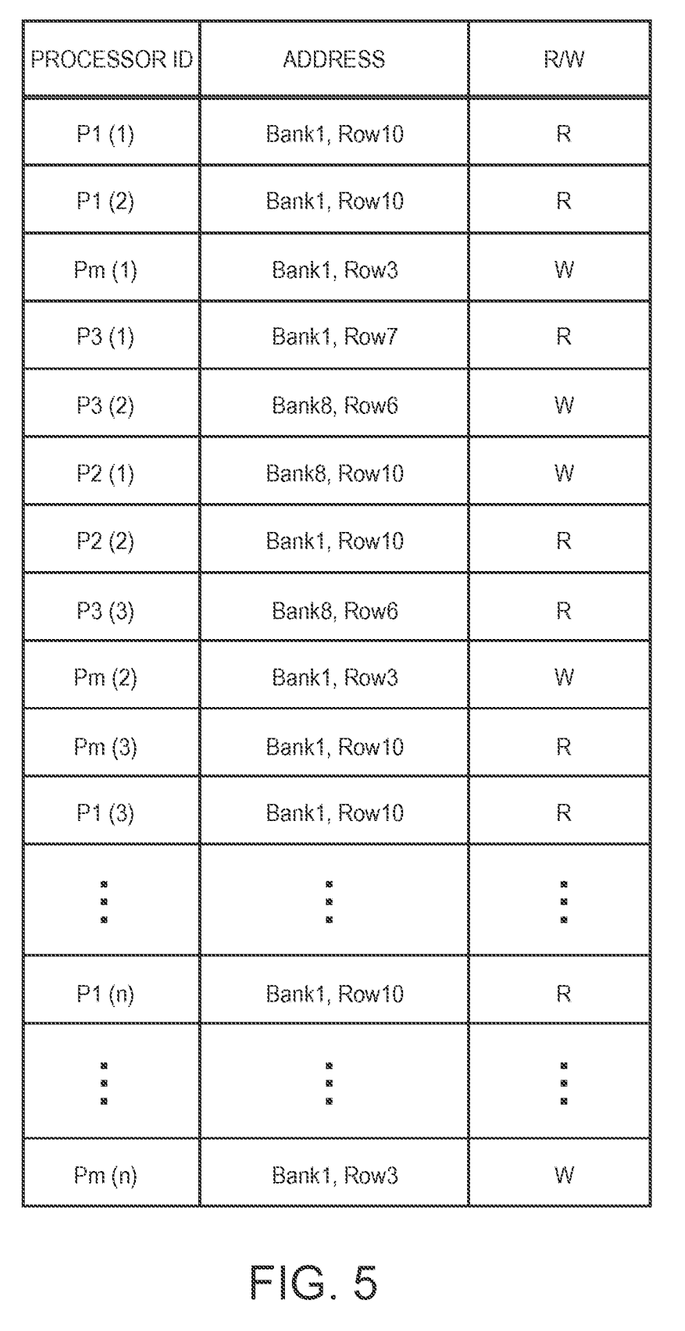
FIG. 5 is a table showing a specific example of content of the request FIFO buffer in one embodiment.
Figure 6:
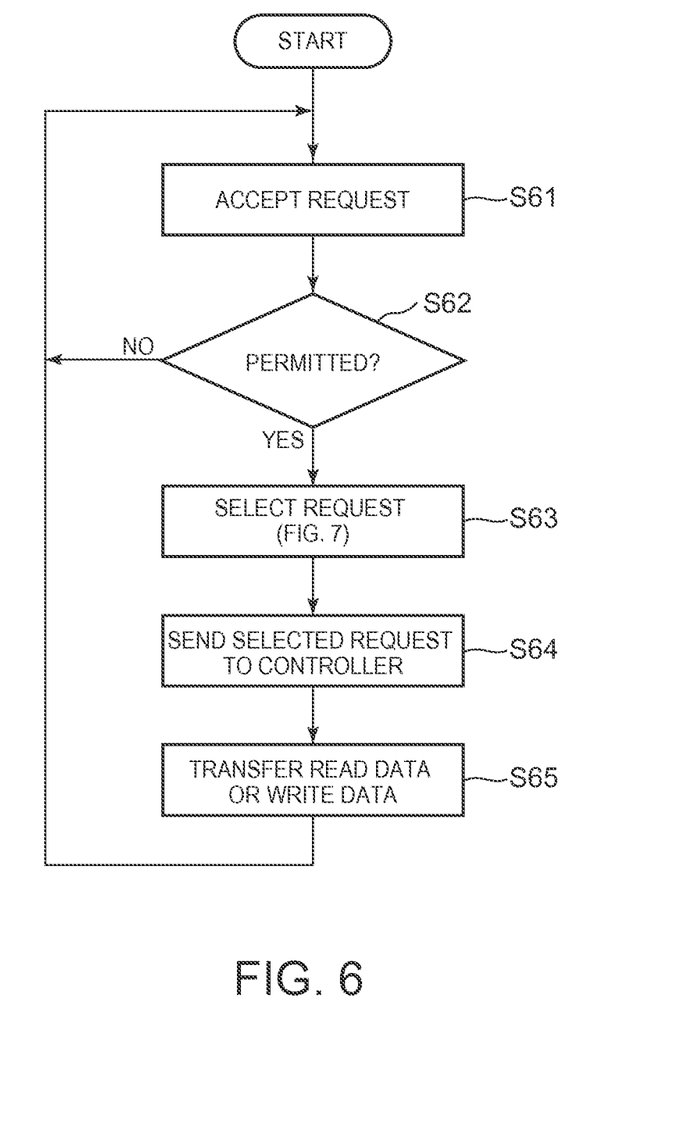
FIG. 6 is a flowchart showing an embodiment of a scheduling method.
Figure 7:
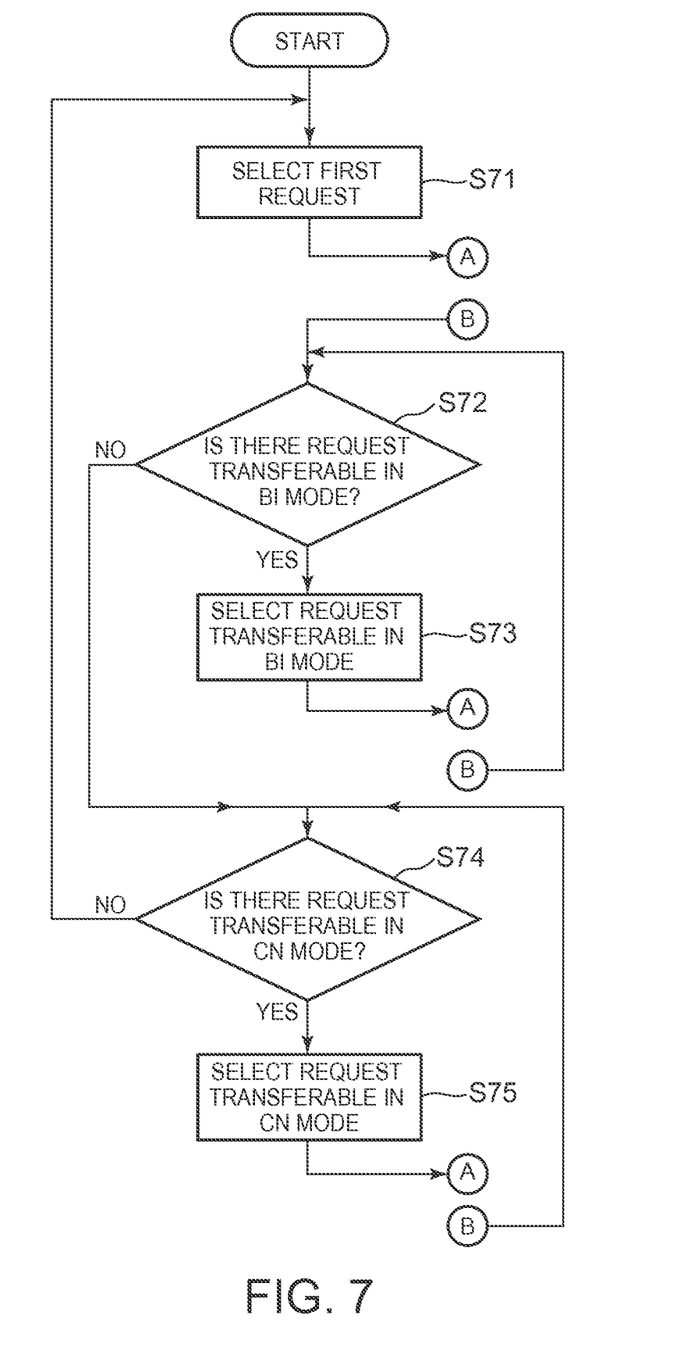
FIG. 7 is a flowchart showing details of steps for selecting access requests in the method of FIG. 6 according to one embodiment.
Figure 8:
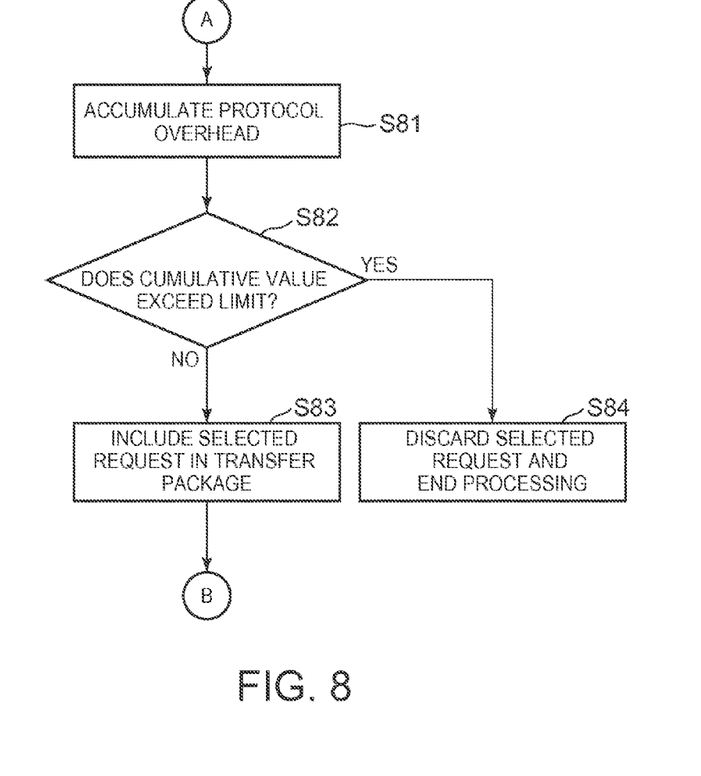
FIG. 8 is a flowchart showing an operation carried out each time an access request is selected in the method of FIG. 7 according to one embodiment.

Referring next to FIG. 5 showing a specific content of the request FIFO included in the access request accepting section 31, and flowcharts in FIGS. 6-8, the operation of the scheduling device according to one embodiment, i.e., the operation of the processor interface 11 is described. Note that the "access request" is simply referred to as the "request" in the flowcharts of FIGS. 6-8.

The request FIFO shown in FIG. 5 is configured to store information on access requests from each processor 12, i.e., the processors ID, the addresses, and the read/write (R/W) signal, from the top to the bottom in order of the arrival of the access requests. Pi(j) in the column of "processor ID" denotes the j-th processor ID (j=1, 2, . . . , n) related to an access request from the i-th processor Pi (i=1, 2, . . . , m). In the case of the request FIFO in FIG. 5, since these pieces of information are stored in order of the arrival of the access requests starting from the top, the order may be identified without storing information (j) indicative of the order of access requests. In the following, it is assumed that Pi(j) in the column of "processor ID" is also used to identify each access request for the purpose of illustration.

In the column of "address," each Bank denotes a bank address and each Row denotes a row address. In practice, although a column address is used to access the shared DRAM 14 as well as these two addresses, the column address is omitted in FIG. 5 because this embodiment uses only the bank address and the row address to schedule the transfer of each access request among these three addresses in a manner to be described later.

In the column of "R/W", R denotes that the access request is a read, and W denotes that the access request is a write.

FIG. 5 shows that processor 1(P1) has first issued a read access request to Bank1 and Row10. The access request accepting section 31 accepts this access request P1(1) in step S61 of FIG. 6, and notifies the DRAM controller interface 34 thereof. In response to this notification, the DRAM controller interface 34 sends a request signal to the DRAM controller 13, and waits for permission (step S62). When receiving the request signal, the DRAM controller 13 sends a permission signal to the DRAM controller interface 34 when the shared DRAM is not being accessed. During the access, the DRAM controller 13 delays the return of the permission signal until the access is completed. In the meantime, subsequent access requests continue to be stored in the request FIFO of the access request accepting section 31 in order of arrival (a path of "NO" from S62). Here, it is assumed that access requests up to the n-th access request Pm(n) of the processor m(Pm) are stored in the request FIFO until the DRAM controller interface 34 is permitted by the DRAM controller 13 (see FIG. 5). When being permitted by the DRAM controller 13, the DRAM controller interface 34 causes the access request selecting section 32 to start the selection of access requests in response to the permission.

The access request selecting section 32 selects access requests in order from among the multiple access requests stored in the request FIFO according to predetermined criteria to be described later, and creates a transfer package including the selected access requests (step S63). Next, the access request selecting section 32 transfers the transfer package including one or more selected access requests to the DRAM controller 13 through the DRAM controller interface 34 (step S64). Finally, when the access request is a read, the data transfer section 33 receives, from the DRAM controller 13, data read from the shared DRAM 14, stores the data in a read FIFO, notifies a processor as the requester that the data are read data through a ready signal, and transfers the read data to the requester processor (step S65). Further, when the access request is a write, the data transfer section 33 makes a request to the requester processor for write data to be written to the shared DRAM 14, stores the write data in a write FIFO, and then transfers the write data to the DRAM controller 14 (step S65).

Since the steps other than step S63 for selecting access requests among the steps mentioned above are well known as described, for example, in U.S. Patent Application Publication No. 2014/0059286 A1, the details thereof will be omitted.

The details of step S63 executed by the access request selecting section 32 are shown in FIG. 7 and FIG. 8.

First, from among multiple access requests stored in the request FIFO of the access request accepting section 31, the access request selecting section 32 selects a first access request as a reference for the selection of a subsequent access request (step S71). It is preferred that this first access request should be an access request having the longest latency in the request FIFO. In this case, in the example of FIG. 5, the access request selecting section 32 selects a read access request P1(1) from processor 1.

Next, the access request selecting section 32 proceeds to step S81 of FIG. 8 to accumulate protocol overhead after the selection of the first access request P1(1) in order to determine whether it goes beyond the limit of an allowable access time allocated to the processor interface 11. Since the first access request P1(1) is a read in the example of FIG. 5, the protocol overhead is, for example, 26 clocks (see FIG. 1). Next, the access request selecting section 32 compares a cumulative value of the protocol overhead with the allowable access time to determine whether the cumulative value goes beyond a limit (e.g., 1000 clocks) (step S82). When not beyond the limit, the access request selecting section 32 includes the selected access request in a transfer package (step S83), and proceeds to the next step (to step S72 of FIG. 7 in this case). In the case of the first access request P1(1), the cumulative value does not go beyond the limit in the above example. However, since the flow of FIG. 8 is executed each time an access request is selected in a manner to be described later, multiple access requests are selected. Then, when the cumulative value of these protocol overheads go beyond the limit, the access request selecting section 32 discards an access request selected most recently, ends the access request selection process (step S84), and proceeds to step S64 of FIG. 6 to transfer the created transfer package to the DRAM controller interface 34. Since the access request discarded in step S84 remains in the request FIFO, the access request becomes a candidate of the access request selection when the flow of FIG. 7 is executed again.

In the next step S72, the access request selecting section 32 scans the entries of the request FIFO in order starting from the top, i.e., in order of latency starting from an access request having the longest latency to determine whether there is an access request transferable in the BI mode with respect to the first access request. In the example of FIG. 5, since the bank address of the first access request is Bank1 and the second access request P3(2) from processor 3(P3) is found as an access request having a bank address different from Bank1, the access request selecting section 32 selects this access request (step S73). When not found, the procedure proceeds to step S74.

As described above, although an access request transferable in the CN mode with respect to the first access request (the second access request P1(2) from the same processor 1(P1) in the example of FIG. 5) is next selected in the prior art, the present invention gives priority to the BI mode. This is because at least two different combinations of addresses (Bank, Row) are used in the BI mode to enable the transfer of subsequent access requests in the CN mode with respect to those combinations.

Following the selection of the access request transferable in the BI mode, the access request selecting section 32 executes the process of FIG. 8 in the manner mentioned above, and when the cumulative value does not beyond the limit, the access request selecting section 32 includes the selected access request in the transfer package. Then, the access request selecting section 32 returns to step S72 to scan access requests in order starting from an access request subsequent to the access request previously selected in step S73 (from P2(1) in the example of FIG. 5) in order to determine whether there is still an access request transferable in the BI mode, i.e., whether there is an access request having any bank address other than Bank1 and Bank8. Thus, in step S72, since the entries in the request FIFO are scanned in order starting from the top, i.e., in order of latency starting from an entry having the longest latency, when the number of access requests to be selected in step S73 is plural, these access requests are selected in order of latency starting from an access request having the longest latency.

When there is no access request transferable in the BI mode, the procedure proceeds to step S74, in which the access request selecting section 32 scans access requests in order starting from an access request subsequent to the access request selected in the request FIFO to compare a combination of the bank address and the row address of the selected access request with a combination of the bank address and the row address of another access request that has not been selected yet in order to determine whether there is an access request transferable in the CN mode. In the example of FIG. 5, the combination of the bank address and the row address of the first selected access request P1(1) is (Bank1, Row10), and access requests having the same combination are P1(2) to P1(*n*), P2(2), and Pm(3) in order starting from the top, i.e., in order of latency starting from the access request having the longest latency. Further, the combination of the bank address and the row address of the access request P3(2) secondarily selected is (Bank8, Row6), and an access request having the same combination is P3(3). Thus, according to one embodiment, since an access request transferable in the BI mode is selected in priority to that in the CN mode, at least two access requests transferable in the CN mode can be selected after that.

The access request selecting section 32 scans access requests in order starting from an access request subsequent to the access request selected in the request FIFO, and when an access request transferable in the CN mode is found (P1(2) is first found in the example of FIG. 5), the access request selecting section 32 selects the access request (step S75), and then executes the process in FIG. 8. In the process of FIG. 8, when the cumulative value does not go beyond the limit, the access request selecting section 32 includes the selected access request in the transfer package, and then returns to step S74 to repeat the selection of an access request transferable in the CN mode. Steps S74 and S75 are repeated so that access requests transferable in the CN mode and having longer latency will be selected in order of latency with respect to the two access requests P1(1) and P3(2) that access different banks, respectively.

As apparent from the above description, an access request transferable in the CN mode is selected when there is no access request transferable in the BI mode (a path from "NO" in step S72 of FIG. 7 to step S75 via step S74), when the preceding access request is in the BI mode (a path from step S73 to step S75 via step S74), or when the preceding access request is in the CN mode (a path from step S83 of FIG. 8 to step S75 via step S74 of FIG. 7).

When there is no access request transferable in the CN mode, the access request selecting section 32 returns to step S71 to select the next access request (Pm(1) in the example of FIG. 5) as a reference for the access request selection from among access requests that have not been selected yet, thus repeating each step mentioned above.

Figure 9:
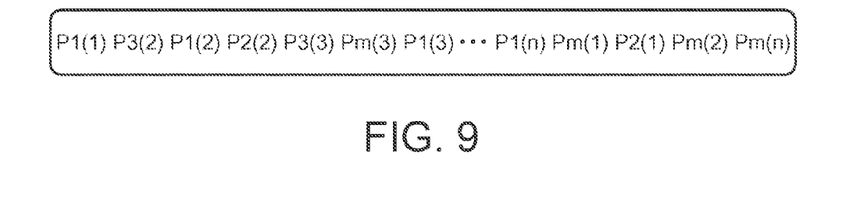
FIG. 9 is a diagram showing an example of a transfer package of access requests created to be sent to a DRAM controller according to one embodiment.

FIG. 9 shows an example of a transfer package composed of multiple access requests thus selected. In the transfer package of FIG. 9, access request P1(1) to access request P1(*n*) are access requests selected in step S74 of FIG. 7 before branching into the "NO" path, and access request Pm(1) to access request Pm(*n*) are access requests selected in the second round of the selection process started after returning from step S74 to step S71. The access request P2(1) immediately behind the access request Pm(1) is an access request transferable in the BI mode with respect to the access request Pm(1) among the access requests that have not been selected by then, i.e., an access request having a bank address different from that of the access request Pm(1). Behind the access request, access requests Pm(2) and Pm(*n*) having the same bank address and row address as those of the access request Pm(1) are selected in order of latency (longer first) as access requests transferable in the CN mode.

The access request selecting section 32 sends this transfer package to the DRAM controller interface 34. In response to each access request included in the transfer package received, the DRAM controller interface 34 supplies a mode signal (a signal indicative of R/W, and the BI mode or the CN mode) and addresses sequentially to the DRAM controller 13. When the access request is a write, the data transfer section 33 is caused to transfer write data to the DRAM controller 13, while when the access request is a read, the data transfer section 33 is caused to receive read data sent from the DRAM controller 13.

The DRAM controller 13 sends the shared DRAM an appropriate command sequence according to the mode signal from the DRAM controller interface 34 to perform reading or writing. For example, in the example of FIG. 9, since the next read access request P3(2) is in the BI mode with respect to the first read access request P1(1), the DRAM controller 13 issues a command sequence as shown in FIG. 1B. Note that since the third access request P1(2) to P1(*n*) are in the CN mode, the precharge command P is not issued until the last access request P1(*n*) in the CN mode. From the subsequent Pm(1), the same command sequence as above is repeated.

As described above, according to one embodiment, an access request transferable in the BI mode is selected with priority over that in the CN mode after the first access request as a reference is selected. After that, when an access request transferable in the CN mode is selected, access requests may be continuously selected with respect to at least two access requests having different bank addresses, and this may maximize the burst transfer size. However, if an access request transferable in the BI mode is first selected, the selection may be out of order in the FIFO. In this case, for example, by attaching a tag, indicating that the selection was made, to a corresponding entry in the request FIFO, such inconvenience that the access request is selected again in the second and following rounds of the access request selection process may be avoided.

While one preferred embodiment has been described, the present invention is not limited to the aforementioned embodiment. Various changes and modifications may be made without departing from the scope and purpose of the present invention. For example, in the aforementioned embodiment, the predetermined allowable access time is allocated to the processor interface 11. However, if only the processor interface 11 is connected to the DRAM controller 13, such an allocation will not be needed. In such a case, the flow of FIG. 8 is unnecessary, but there is a need to predefine when the transfer is aborted instead of step S84. Such a definition may be determined arbitrarily.

What is claimed is:

1. A scheduling device for scheduling access requests from each of a plurality of requesters to a memory shared among the plurality of requesters, the scheduling device comprising:
   an access request accepting section configured to accept access requests from each of the plurality of requesters; and
   an access request selecting section configured to:
      select a first access request as a reference for access request selection from among the access requests accepted by the access request accepting section;
      select an access request transferable in a bank interleave (BI) mode with respect to the first access request; and
      select an access request transferable in a continuous read/write (CN) mode in response to a determination that there is no access request transferable in the BI mode or a preceding access request was in the BI mode or the CN mode,
   wherein in response to a determination that there is no access request transferable in the BI mode and that there is no access request transferable in the CN mode, the access request selecting section repeats selection of the first access request, the access request transferable in the BI mode, and the access request transferable in the CN mode from among access requests that have not been selected yet.

2. The scheduling device as recited in claim 1, wherein a predetermined access time is allocated to the scheduling device, and wherein the access request selecting section is configured to repeat selection of the first access request, the access request transferable in the BI mode, and the access request transferable in the CN mode within a limit of the access time.

3. The scheduling device as recited in claim 1, wherein the access request accepting section is configured to store the access requests from each of the requesters in a first-in first-out (FIFO) buffer in order of arrival, and wherein the access request selecting section is configured to select, as the first access request, an access request having a longest latency from among the access requests stored in the FIFO buffer.

4. The scheduling device as recited in claim 3, wherein a predetermined access time is allocated to the scheduling device, and wherein the access request selecting section is configured to repeat selection of the first access request, the access request transferable in the BI mode, and the access request transferable in the CN mode within a limit of the access time.

5. The scheduling device as recited in claim 3, wherein the access request selecting section is configured to scan the access requests stored in the FIFO buffer in order of latency starting from an access request having the longest latency to determine whether there is an access request transferable in either of the BI mode and the CN mode.

6. The scheduling device as recited in claim 5, wherein a predetermined access time is allocated to the scheduling device, and wherein the access request selecting section is configured to repeat selection of the first access request, the access request transferable in the BI mode, and the access request transferable in the CN mode within a limit of the access time.

7. The scheduling device as recited in claim 6, wherein the access request selecting section is configured to:
   accumulate protocol overhead of a selected access request each time the access request is selected; and
   compare a cumulative value of the accumulated protocol overhead with the access time to determine whether the cumulative value goes beyond the limit of the access time.

8. A method for scheduling access requests from each of a plurality of requesters to a memory shared among the plurality of requesters, the method comprising:
   accepting access requests from each of the plurality of requesters;
   selecting a first access request as a reference for an access request selection from among the access requests;
   selecting an access request transferable in a bank interleave (BI) mode with respect to the first access request; and
   selecting an access request transferable in a continuous read/write (CN) mode in response to a determination that no access request is transferable in the BI mode or that a preceding access request was transferable in the BI mode or the CN mode,
   wherein the selecting the first access request, the selecting the access request transferable in the BI mode, and the selecting the access request transferable in the CN mode from among access requests that have not been selected yet are repeated in response to a determination that there is no access request transferable in the BI mode and that there is no access request transferable in the CN mode.

9. The method as recited in claim 8, wherein the accepting access requests further comprises storing the access requests from each of the requesters in a first-in first-out (FIFO)

buffer in an order of arrival, and wherein the selecting the first access request further comprises selecting an access request having a longest latency as the first access request from among the access requests stored in the FIFO buffer.

10. The method as recited in claim 9, further comprising allocating a predetermined access time to a device for carrying out the method, and wherein the selecting the first access request, the selecting the access request transferable in the BI mode, and the selecting the access request transferable in the CN mode are repeated within a limit of the access time, respectively.

11. The method as recited in claim 9, wherein the selecting the access request transferable in the BI mode further comprises scanning access requests stored in the FIFO buffer in order of latency starting from an access request having the longest latency to determine whether there is an access request transferable in the BI mode.

12. The method as recited in claim 11, further comprising allocating a predetermined access time to a device for carrying out the method, and wherein the selecting the first access request, the selecting the access request transferable in the BI mode, and the selecting the access request transferable in the CN mode are repeated within a limit of the access time, respectively.

13. The method as recited in claim 9, wherein the selecting the access request transferable in the CN mode further comprises scanning access requests stored in the FIFO buffer in order of latency starting from an access request having the longest latency to determine whether there is an access request transferable in the CN mode.

14. The method as recited in claim 13, further comprising allocating a predetermined access time to a device for carrying out the method, and wherein the selecting the first access request, the selecting the access request transferable in the BI mode, and the selecting the access request transferable in the CN mode are repeated within a limit of the access time, respectively.

15. The method as recited in claim 8, further comprising allocating a predetermined access time to a device for carrying out the method, and wherein the selecting the first access request, the selecting the access request transferable in the BI mode, and the selecting the access request transferable in the CN mode are repeated within a limit of the access time, respectively.

16. The method as recited in claim 15, wherein the selecting the first access request, the selecting the access request transferable in the BI mode, and the selecting the access request transferable in the CN mode each further comprise:
  accumulating protocol overhead of a selected access request each time the access request is selected; and
  comparing a cumulative value of the accumulated protocol overhead with the access time to determine whether the cumulative value goes beyond the limit of the access time.

17. A computer program product for scheduling access requests from each of a plurality of requesters to a memory shared among the plurality of requesters, the computer program product comprising a non-transitory memory having program instructions embodied therewith, the embodied program instructions readable by a computer to cause the computer to perform a method comprising:
  accepting access requests from each of the plurality of requesters;
  selecting a first access request as a reference for an access request selection from among the access requests;
  selecting an access request transferable in a bank interleave (BI) mode with respect to the first access request; and
  selecting an access request transferable in a continuous read/write (CN) mode in response to either a determination that no access request is transferable in the BI mode or that a preceding access request was transferable in the BI mode or the CN mode,
  wherein the selecting the first access request, the selecting the access request transferable in the BI mode, and the selecting the access request transferable in the CN mode from among access requests that have not been selected yet are repeated in response to a determination that there is no access request transferable in the BI mode and that there is no access request transferable in the CN mode.

18. The computer program product as recited in claim 17, wherein the method step of accepting access requests further comprises storing the access requests from each of the requesters in a first-in first-out (FIFO) buffer in an order of arrival, and wherein the selecting the first access request further comprises selecting an access request having a longest latency as the first access request from among the access requests stored in the FIFO buffer.

19. The computer program product as recited in claim 18, wherein the method further comprises allocating a predetermined access time to a device for carrying out the method, and wherein the selecting the first access request, the selecting the access request transferable in the BI mode, and the selecting the access request transferable in the CN mode are repeated within a limit of the access time, respectively.

20. The computer program product as recited in claim 17, wherein the method step of selecting the first access request, the method step of selecting the access request transferable in the BI mode, and the method step of selecting the access request transferable in the CN mode each further comprise:
  accumulating protocol overhead of a selected access request each time the access request is selected; and
  comparing a cumulative value of the accumulated protocol overhead with the access time to determine whether the cumulative value goes beyond the limit of the access time.

* * * * *